(12) United States Patent
Bratkovski et al.

(10) Patent No.: US 6,791,338 B1
(45) Date of Patent: Sep. 14, 2004

(54) GATED NANOSCALE SWITCH HAVING CHANNEL OF MOLECULAR WIRES

(75) Inventors: Alexandre Bratkovski, Mountain View, CA (US); Yong Chen, Palo Alto, CA (US); Theodore I Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 64 days.

(21) Appl. No.: 10/355,748

(22) Filed: Jan. 31, 2003

(51) Int. Cl.[7] ............................................... G01R 27/00
(52) U.S. Cl. ...................... 324/600; 324/158.1; 257/29; 257/30
(58) Field of Search .............................. 324/158.1, 600, 324/766, 767, 768, 769; 257/29, 30, 31, 32, 38, 39; 438/257

(56) References Cited

U.S. PATENT DOCUMENTS

| | | | |
|---|---|---|---|
| 6,432,740 B1 | | 8/2002 | Chen |
| 2003/0121764 A1 | * | 7/2003 | Yang et al. .................. 200/262 |
| 2004/0063282 A1 | * | 4/2004 | Stasiak et al. ............... 438/257 |
| 2004/0084691 A1 | * | 5/2004 | Chen et al. .................. 257/192 |

OTHER PUBLICATIONS

S. Chou et al., "Ultrafast and Direct Imprint of Nano–structures in Silicon", *Nature*, vol. 417 (Jun. 20, 2002) pp. 835–837.

X. Cui et al., "Reproducible Measurement of Single–Molecule Conductivity", *Science*, vol. 294 (Oct. 19, 2001), pp. 571–574.

S. Datta et al., "Current–Voltage Characteristics of Self–Assembled Monolayers by Scanning Tunneling Microscopy," *Physical Review Letters*, vol. 79 (Sep. 29, 1997), pp. 2530–2533.

C. Kagan et al., "Organic–Inorganic Hybrid Materials as Semiconducting Channels in Thin–Film Field–Effect Transistors", *Science*, vol. 286 (Oct. 29, 1999) pp. 945–947.

C. Kergueris et al., "Electron Transport Through a Metal–Molecule–Metal Junction", *Physical Review B,* vol. 59 No. 19 (May 15, 1999), pp. 12 505–12 513.

A. Morpurgo et al., "Controlled Fabrication of Metallic Electrodes With Atomic Separation", *Applied Physics Letters*, vol. 74, No. 14 (Apr. 5, 1999), pp. 2084–2086.

H. Park et al., "Fabrication of Metallic Electrodes With Nanometer Separation by Electromigration", *Applied Physics Letters,* vol. 75, No. 2 (Jul. 12, 1999), pp. 301–303 (Note Fig. 3(a) and accompanying discussion).

H. Park et al., "Nanomechanical Oscillations in a Single C60 Transistor", *Nature,* vol. 407 (Sep. 7, 2000), pp. 57–60.

M. Reed et al., "Conductance of a Molecular Junction", *Science,* vol. 287 (Oct. 10, 1997), pp. 252–254.

J. Reichert et al., "Driving Current Through Single Organic Molecules", *Physical Review Letters*, vol. 88, No. 17 (Apr. 20, 2002), pp. 176804–1 through 176804–4.

H. Sakaguchi et al., "Determination of Performance on Tunnel Conduction Through Molecular Wire Using a Conductive Atomic Force Microscope", *Applied Physics Letters,* vol. 79, No. 22, (Nov. 26, 2001).

J. Tour, "Molecular Electronics, Synthesis and Testing of Components", *Acc. Chem. Res. 2000,* vol. 33, No. 11, pp. 791–804.

* cited by examiner

*Primary Examiner*—David A. Zarneke
*Assistant Examiner*—Tung X. Nguyen

(57) ABSTRACT

A gated nanoscale switch operates as a resonant tunneling device. A conductive channel is formed of a pair of conductive molecular wires and a conductive nanoparticle. Each molecular wire is bound, at one end, to the conductive nanoparticle and, at the opposed end, to one of a pair of electrodes. The structure is located upon a dielectric layer that overlies a conductive substrate. The device may be arranged to operate as a switch with the conductive substrate acting as a gate electrode. Alternatively, the device may be employed to measure the electrical (current versus voltage) characteristics of the molecular wires.

27 Claims, 7 Drawing Sheets

GATED NANOSCALE SWITCH HAVING CHANNEL OF MOLECULAR WIRES

BACKGROUND

1. Field of the Invention

The present invention relates to nanometer scale electronic devices. More particularly, this invention pertains to nanoscale switches and to devices for measuring the electrical characteristics of conjugated molecular wires.

2. Description of the Prior Art

The emerging field of nanotechnology and nanometer-scale devices offers the promise of molecular digital logic circuits that are on the order of one million times smaller than the corresponding conventional silicon semiconductor logic circuits. (Note: "nanometer scale" ranges from approximately 0.1 to 50 nanometers in contrast to the sub-micron scale range of approximately 50 nanometers (0.05 micrometers) to one micrometer and the micron scale range of approximately one to a few micrometers, each of which is commonly encountered in silicon device technology.)

Nanometer-scale devices are based upon molecular building blocks having well-understood electrical properties. Such molecular building blocks are arranged to operate analogously to micron scale or submicron scale electronic devices.

The very small scale of nanoscale devices introduces, or enhances the importance of certain fabrication issues, such as the creation of nanoscale gaps between metallic electrodes.

One of the primary circuit elements of digital logic and systems is the three terminal voltage-controlled switch in which a flow of current between a pair of electrodes is regulated by the application of a gating voltage at a third device electrode. Unfortunately, this essential step in the development of nanoscale systems has been hampered by known physical limitations associated with the very small size desired. Such limitations have complicated the search for a nanoscale analog to the field effect transistor ("FET").

In a traditional micron-scale FET formed in silicon, a gate electrode is provided for applying a voltage that regulates the conductance of a channel sandwiched between source and drain electrodes. For example, the interaction of the gate voltage with the material of the channel regulates the size of a depletion region devoid of majority carriers (holes or electrons) and strongly affects the conducting channel. This phenomenon and mode of operation, whereby the resultant source-to-drain current flow is regulated by the switching effect of a gating voltage, is well understood in the art.

The above-described manner of operation of a FET cannot be obtained when the device is reduced to nanometer scale (e.g., channel length less than 15 nm) since, with such a small channel length, the separation between source and drain electrodes is too small to allow the gate voltage to predominately control the carrier density. Current is controlled by injection from the source electrode.

FIG. 1 shows a prior art FET having a source electrode 14 and a drain electrode 16, each of highly-doped silicon, formed on a dielectric layer 18 that, in turn, is formed on top of a highly doped substrate 20 that serves as gate electrode. A spin-coated thin layer 22 of organic material, about 300 Angstroms (=30 nm) thick, lies between the source and drain electrodes 14 and 16 and serves as the channel region of the FET 10. Application of a voltage to the gate electrode controls conductance through the organic layer 22 between the source and drain electrodes.

The channel comprises the organic layer 22, but the remainder of the FET 10 comprises a standard silicon technology layout with the conductance between source and drain electrodes controlled by the response of the organic layer 22 to the applied gate voltage.

A relatively high gate voltage (30 to 50 V), a function of the thickness of the dielectric layer 18, is required to change the conductance of the layer 22 of organic material. Since the conductance and mobility of an organic layer are relatively low (i.e., less than 1 $cm^2/(V-s)$), an often-unacceptably slow switching speed and low drain current are obtained.

SUMMARY OF THE INVENTION

The preceding and other shortcomings of the prior art are addressed by the present invention that provides, in a first aspect, a nanoscale switch. Such switch includes a conductive substrate. A dielectric layer overlies the conductive substrate.

A first electrode and a second electrode are located on the dielectric layer in spaced relation separated from one another by a gap. A first electrically conductive molecular wire and a second electrically conductive molecular wire are provided.

The first molecular wire is bound to the first electrode and to an electrically conductive nanoparticle and the second molecular wire is bound to the second electrode and to the nanoparticle whereby an electrically conductive path exists between the first and second electrodes.

In a second aspect, the invention provides apparatus for measuring the electrical characteristics of conductive molecular wires. Such method is begun by providing a layer of dielectric material. A first electrode and a second electrode are formed on the dielectric layer with a gap therebetween.

A first plurality of electrically-conductive molecular wires is bonded to the first electrode and a second plurality of molecular wires is bonded to the second electrode. The electrical conductivity of the nanoparticle exceeds that of the first and said second molecular wires. An electrically-conductive nanoparticle is then bonded to at least one molecular wire of the first plurality of molecular wires and to at least one molecular wire of the second plurality of molecular wires.

A voltage difference is then created between the first and second electrodes and a resultant flow of electrical current between the first and second electrodes through the molecular wires and nanoparticle is measured.

In a third aspect, the invention provides apparatus for measuring electrical characteristics of conductive molecular wires. Such apparatus includes a layer of dielectric material. A first electrode and a second electrode are located on the layer of dielectric material in spaced relation separated from one another by a gap.

First and second electrically conductive molecular wires are provided. The first molecular wire is bound to the first electrode and to a conductive nanoparticle and the second molecular wire is bound to the second electrode and to the nanoparticle whereby an electrically conductive path exists between the first and second electrodes.

Means are provided for establishing a voltage difference between said first and second electrodes as well as means for measuring the flow of current between the first and second electrodes through the electrically conductive path in response to such voltage difference between the first and second electrodes.

The preceding and other features of the present invention will become clear from the detailed description that follows. Such description is accompanied by a set of drawing figures. Numerals of the drawing figures, corresponding to those of the written description, point to the features of the invention. Like numerals refer to like features throughout both the written description and the drawing figures.

DETAILED DESCRIPTION OF THE PREFERRED EMBODIMENT

FIGS. 2(a) through 2(f) are a series of cross sectional views for illustrating a method for making a gated nanoscale switch in accordance with an embodiment of the invention. The invention described and claimed herein relies upon resonant tunneling for operation. Due to the configuration of the resultant device, which includes a conductive path through molecular wires, it is also useful for measuring the electrical characteristics of such molecular wires. Molecular wires provide potentially useful building blocks of future nanoscale electronic devices.

Figure 2A:
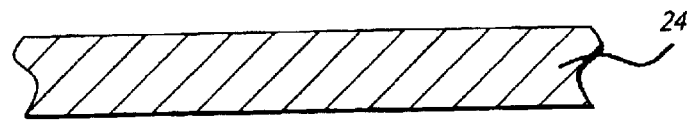
FIGS. 2(a) through 2(f) illustrate a sequence of steps for forming a gated nanoscale switch in accordance with an embodiment of the invention.
Figure 2B:
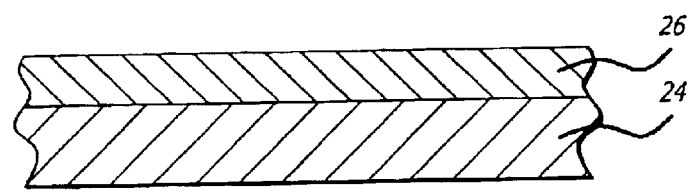

The illustrated process is begun, as shown in FIG. 2(a), by preparing a conductive substrate 24. The substrate 24, which will provide the gate electrode of the resultant device, is preferably formed of a conductive material such as highly doped single crystal or polycrystalline silicon, tantalum and the like. Other materials suitable for forming the substrate include aluminum, calcium, hafnium, lanthanum, magnesium, platinum, strontium, tantalum, tungsten, yttrium and zirconium. A thin dielectric layer 26 (e.g. $SiO_2$, $Al_2O_3$, MgO, CaO, $ZrSiO_4$, $ZrO_2$, $Y_2O_3$, $HfSiO_4$, $HfO_2$, $Si_3N_4$, SrO, $La_2O_3$, $Ta_2O_5$, BaO and $TiO_2$) is then thermally grown or deposited on the substrate 24 as illustrated in FIG. 2(b). The dielectric layer 26 is preferably between 1.5 and 2 nm ($SiO_2$ equivalent dielectric thickness) to permit the effective imposition of a gating voltage (discussed below) upon the molecular wire channel of the device.

Figure 2C:
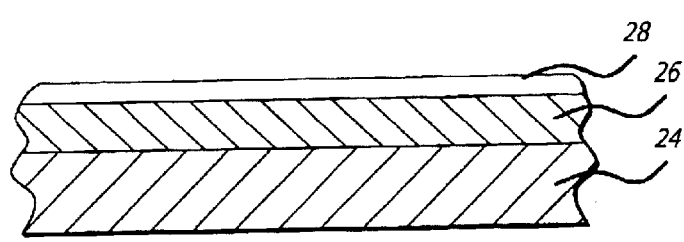
Figure 2C:
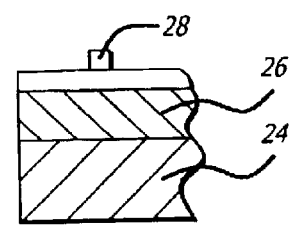

A nanowire 28 of an appropriate conductor including, but not limited to, gold, platinum or tungsten, for forming the source and drain electrodes of the gated switching device is then patterned onto the dielectric layer 26 as illustrated in FIG. 2(c). Such a nanowire 28, a transverse sectional view of which is shown in FIG. 2(c)', may be formed by a number of processes known in the art including, but not limited to, nanoimprinting. In nanoimprinting, a layer of electrode material is first deposited onto the dielectric layer 26 to a thickness of about 5 to 100 nm, preferably by evaporation or chemical vapor deposition (CVD). A mold of silicon, fused silica or other rigid material, with ridges that separate grooves defining the nanowire is then prepared by reactive ion etching (RIE). The nanowire 28 formed by the process is preferably of 5 to 100 nm thickness.

Figure 2D:
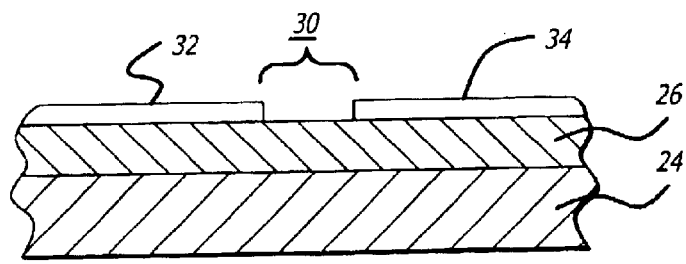

A nanometer scale gap 30, illustrated in FIG. 2(d), is then created between disjointed sections of the formerly continuous metallic nanowire 28 leaving the nanowire sections, which will serve in the resultant device as a left electrode 32 and a right electrode 34 in opposed spaced relationship. The gap preferably provides a separation of about one to 5 nm between the electrodes 32 and. 34.

The gap 30 is preferably created by breaking the nanowire 28 by controlled passage of electrical current therethrough. Such process is monitored by observing the voltage drop across the nanowire 28 during current passage with probes. A conductance trace is obtained with an increase in voltage indicating electromigration and eventual breaking of the nanowire 28, leaving the electrodes 32 and 34 separated by the gap 30. The gap 30 is preferably between 1 and 5 nm wide.

Figure 2E:
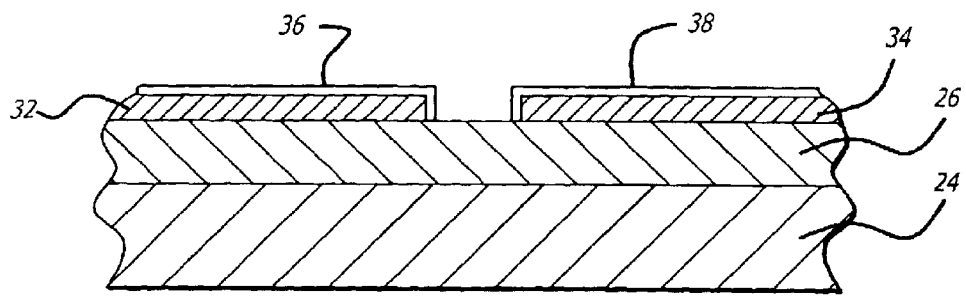
Figure 2E:
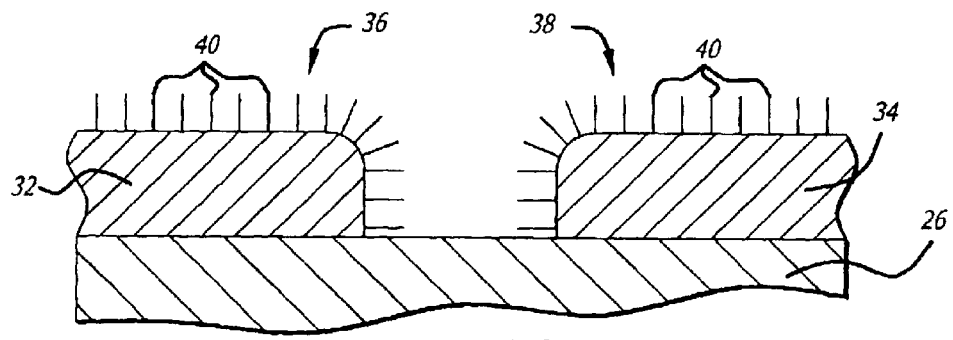

Self-assembled monolayers (SAMs) 36 and 38 of organic material are deposited over the electrodes 32 and 34 respectively as illustrated in FIG. 2(e) by first rinsing the structure with a solution containing molecular wires. Such molecular wires may include thiol (-SH group) or other so-called "anchor" or "alligator clip" chemical groups at their opposed ends that cause the molecules to bond to the electrodes 32 and 34. The choice of anchor chemical group is dependent upon the material of the electrodes 32, 34 (as well as that of a nanoparticle, discussed below). The rinsed structure may be left up to 24 hours under a hood, whereupon the SAM layers 36 and 38 form over the electrodes 32 and 34 as illustrated.

Molecular wires comprise molecules of a special type roughly characterized by an aspect ratio of 2:1 or greater and conjugated pi-electron orbitals spread across the entire molecule. Examples of such molecules include polyacetylene ($[CH]_n$), polyphenylene (a type of molecule in which a plurality of phenylene ($C_6H_4$) rings are bound to one another and terminated with phenyl groups ($C_6H_5$) at either end) as well as so-called Tour wires, a "necklace" of adjoined benzene rings (—$[C_6H_4C_2]$—) of particular lengths.

Molecular wires may include phenyl or thiophene ($C_5S$) rings with conjugated extended pi-electron states and are generally characterized by relatively small (on the order of 1–2 eV) band gaps. Thus, they are electrically conductive. By bonding SH thiol or other anchor groups at their ends, the molecular wires are rendered capable of forming effective bonds to metallic (commonly gold) electrodes. The shortest molecular wire contains only a single phenyl ring and two thiol (SH) groups at the ends (e.g. benzene-(1,4)-dithiolate (BDT) and α, α'-xylyl-dithiolate molecules). Examples of molecular wires suitable for use in the present invention include, but are not limited to, 1-dedanethiol, 1,4-benzenedimethanethiol, poly(1,4-phenylene sulfide), (2,4,5-tris-mercaptomethyl-phenyl)-methanethiol and 4,4'-thiobisbenzenethiol.

FIG. 2(e)' is an enlarged view of a portion of FIG. 2(e) for illustrating the orientations of individual molecular wires 40 of the monolayers 36 and 38 with respect to the underlying electrodes 32 and 34. As can be seen, the molecular wires 40 comprise individual molecules within the monolayers 36 and 38 anchored or bonded at an end to one of the electrodes 32 or 34. Such attachment indicates the ready bonding of an end (e.g. thiol or other anchor) group with the metallic material of the electrodes 32 and 34.

Figure 2F:
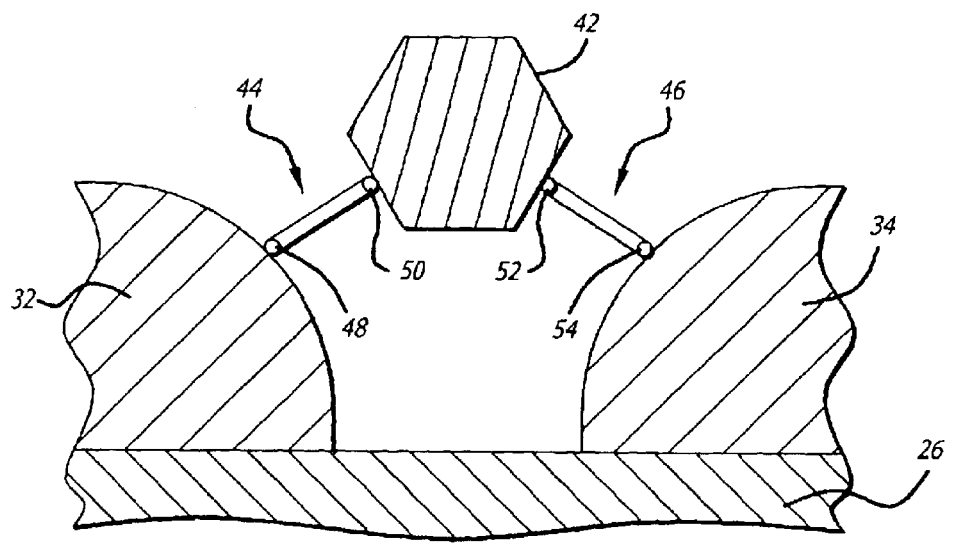

As illustrated in FIG. 2(f), at least one nanoparticle 42 of material having greater conductivity than the molecular wires 40 is deposited by solution phase deposition from a mixture of colloidal nanoparticles of predetermined composition and size after the monolayers 36 and 38 of molecular wires have been deposited upon the electrodes 32. It is desirable that the size of the nanoparticles of the colloidal solution be smaller than the gap 30 between the electrodes 32 and 34 so that only a single molecular wire will bond at its opposed ends to an electrode and to a nanoparticle 42 from the colloidal solution. Preferably, a colloidal solution of concentration of $5.7 \times 10^{12}$ or more (per ml) 10 nm diameter (or smaller) gold particles is employed. Such a solution is manufactured, for example, by British BioCell International.

As shown in FIG. 2(f), a molecular wire 44 is mutually bound to the left electrode 32 and to the nanoparticle 42 by anchor groups 48 and 50 located at its opposed ends while a molecular wire 46 is mutually bound to the nanoparticle 42 and to the right electrode 34 by end anchor groups 52 and 54. This results in a device structure in which the conductive nanoparticle 42 bridges the electrodes 32 and 34, connected to each section through a somewhat-less conductive molecular wire. A similar structure, differing in structure from that of the invention, inter alia, by employing nonconducting molecular wires and a nanoparticle of CdSe, whereby a conductive path is not provided through the molecular wires between spaced electrodes, is disclosed in FIG. 3 of article of Park et al., "Fabrication of Metallic Electrodes With Nanometer Separation by Electromigration", App. Phys. Lett., vol. 75 (1999), pp. 301.

The nanometer scale device of FIG. 2(f) is capable of being arranged to function as a gated switch and, in the alternative, as a device for measuring the electrical characteristics of conductive molecular wires. Unlike the previously discussed hybrid FET of the prior art, the device of FIG. 2(f) is of nanometer, rather than micron, scale. Further, as will be seen, the mode of operation of the device of the invention is unlike that of such prior art device (as well as other attempts to form a FET employing a channel of SAM material) insofar as it is a mesoscopic resonant tunnel device whose principle of operation will be discussed below. As a consequence, when configured as a switch, it does not face the inherent limitations of such prior art devices that arise from the low conductance and mobility of organic materials employed.

Figure 3A:
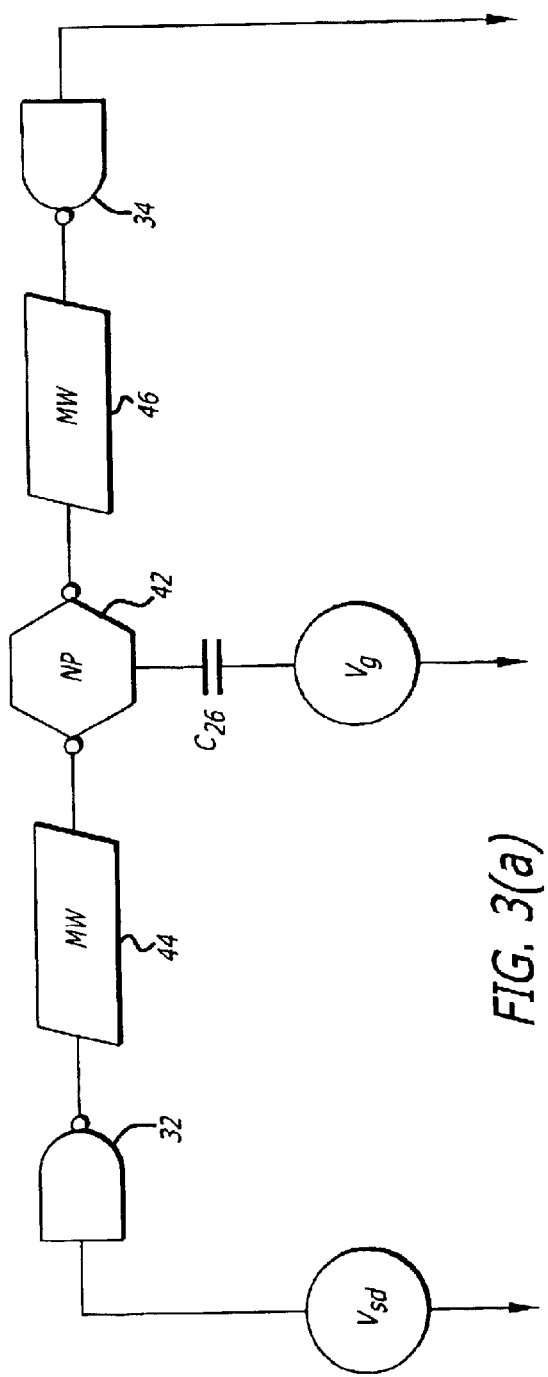
FIGS. 3(a) and 3(b) are schematic diagrams of a nanoscale switch and a device for measuring the electrical characteristics of molecular wires, respectively, in accordance with embodiments of the invention.
Figure 3B:
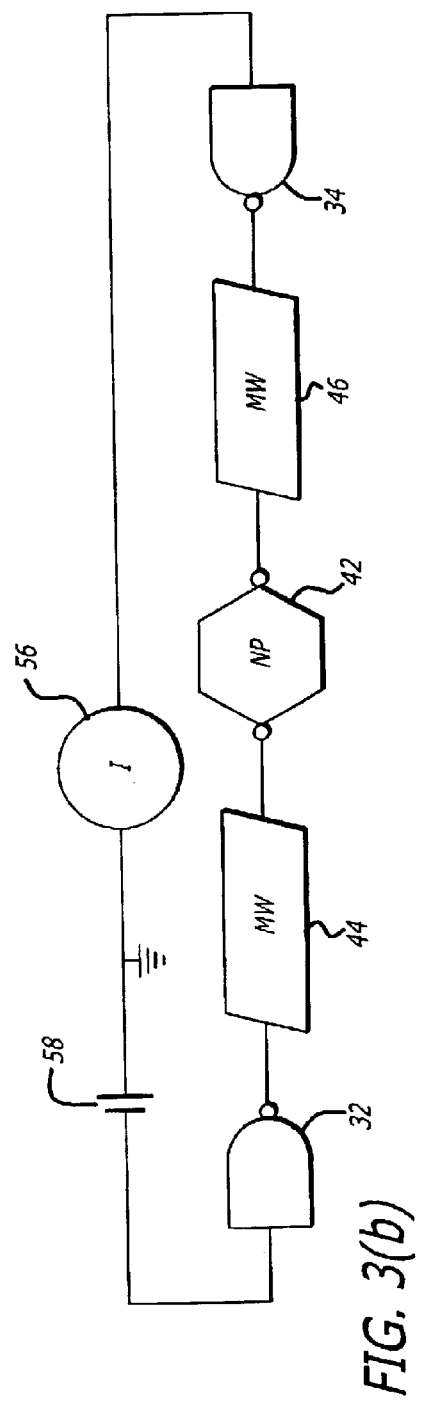

FIGS. 3(a) and 3(b) are electrical schematic diagrams of the device of FIG. 2(f) above, arranged as a gated nanoscale switch and as an apparatus for measuring the electrical characteristics of molecular wires respectively. Referring first to FIG. 3(a), the device is arranged as a gated nanoscale switch by applying a potential $V_{sd}$ between the left electrode 32 and the right electrode 34 and a gating potential $V_g$ to the underlying gate formed of the conductive substrate 24 (not shown in FIG. 3(a)). The value $C_{26}$ represents the capacitance between the nanoparticle 42 and the conductive substrate 24 that functions as the gate electrode. This value is due primarily to the effective thickness of the dielectric layer 26. The theory of operation of the device configured as a gated nanoscale switch will be discussed with reference to subsequent figures.

As mentioned above, the design of useful nanoscale devices is dependent upon an understanding of the electrical characteristics of such building blocks as molecular wires. Despite the central importance of such characterization, well-known experimentation difficulties and complexities have limited success and usefulness when obtaining the essential current-versus-voltage (I-V) characteristics of the single conjugated molecules. Such attempts, generally employing two-terminal devices, have been hampered and complicated by the difficulty of obtaining the single-molecule gap between electrodes required by the break junction technique.

Another difficult-to-employ technology for measuring I-V characteristics of molecular films, conducting AFM (atomic force microscopy), requires the probing of molecules through coated gold particles. Such studies have been conducted on insulating molecular wires (i.e. alkane chains). The results of such studies are difficult to interpret due to the effects of Coulomb blockade on the gold particle attached to the top side of the dithiol anchors of the insulating molecules. Such a difficulty is avoided in the present invention as the nanoparticle 42 is separated from the electrodes 32, 34 by conducting conjugated molecules (the molecular wires 44 and 46) rather than wide bandgap insulating barriers. This will become apparent from the discussion of an arrangement of a device in accordance with an embodiment of the invention for measuring the electrical characteristics of conjugated molecules which follows.

The schematic diagram of FIG. 3(b) discloses an arrangement of the device produced in FIG. 2(f) that enables one to make measurements of the electrical characteristics of molecular wires. The device thus increases the potential uses of such molecules as building blocks for future nanoscale electronic devices. The arrangement of FIG. 3(b) includes a current measurement device 56, such as a digital ammeter, within a circuit that includes a variable voltage source 58 for generating a range of voltage differences between the left and right electrodes 32 and 34 respectively. Conductive pads (not illustrated) in contact with the left and right electrodes 32 and 34 enable contact to the nanoscale device by means of conventional probes (not illustrated). The circuit branch that includes the current measurement device 56 and the variable voltage source 58 thereby completes a circuit that includes a conductive path comprising the conductive nanoparticle 42 and the molecular wires 44 and 46. This provides an architecture that enables simplified measurement of the current-voltage characteristic of the molecular wires of the device. Of course, as a number of different conjugated molecules may be utilized for the molecular wires in a device in accordance with the invention, the invention thus provides a means for measuring the electrical characteristics of different conjugated molecules. Unlike other arrangements for measuring the electrical characteristics of molecules, in the invention, the size of the gap 30 between the opposed electrodes 32 and 34 needn't coincide with the length of the molecule being measured. This provides a distinct advantage over arrangements in which a single molecule is directly bonded, at its opposed anchor ends, to electrodes. Such arrangements demand much greater precision in the fabrication and location of the electrodes than does the present invention.

A theoretical explanation of the operation of the invention will now follow. Such discussion represents the inventors' best present understanding of the operation of the invention as a switch and as an apparatus and method for measuring the electrical characteristics of molecular wires. While such theoretical explanation is believed to be complete and accurate, the disclosure of the invention is dependent neither upon the accuracy nor the completeness of the theoretical exposition that follows.

Figure 4A:
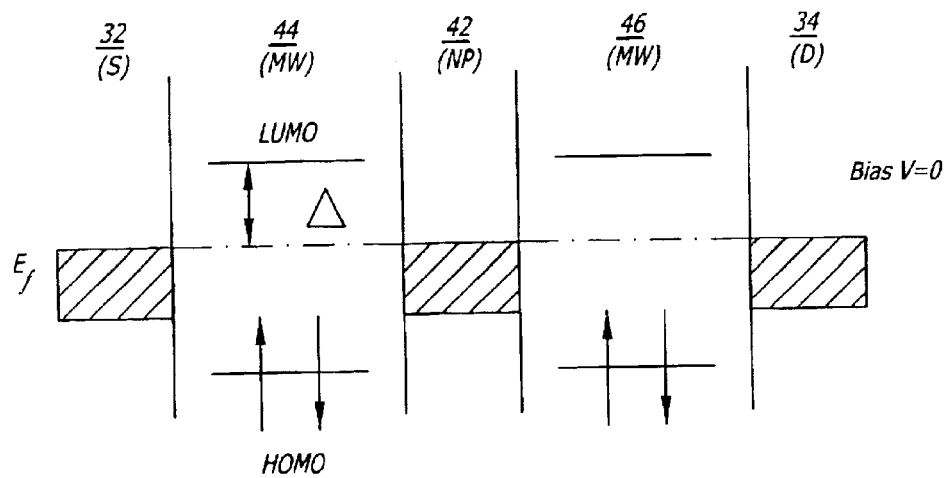
FIGS. 4(a) and 4(b) are energy diagrams for illustrating the process of resonant tunneling in a device in accordance with an embodiment of the invention.
Figure 4B:
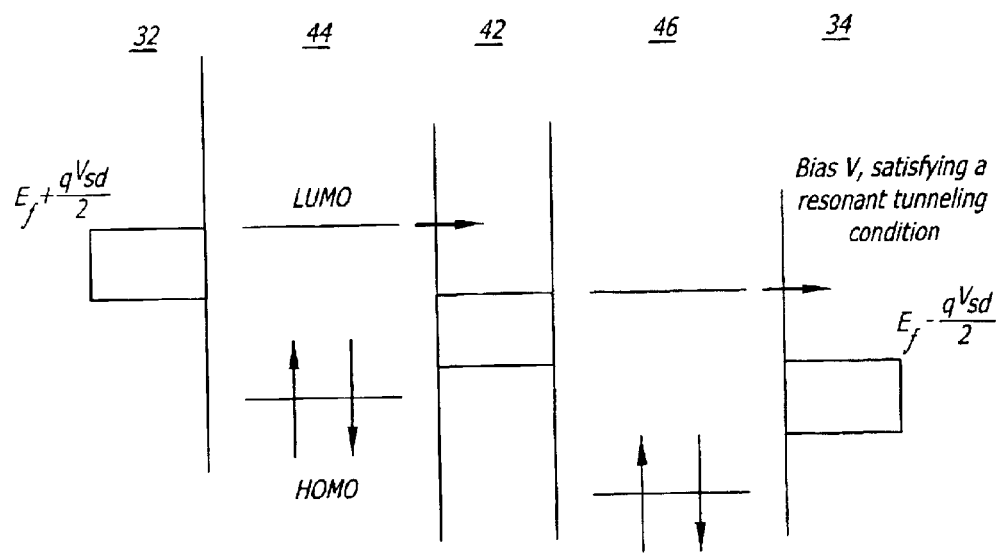

FIGS. 4(a) and 4(b) are energy diagrams for illustrating the process of resonant tunneling in a device in accordance with an embodiment of the invention. FIG. 4(a) illustrates the relative energy states of the left electrode 32, the molecular wires 44 and 46, the nanoparticle 42 and the right electrode 34 at zero source electrode-to-drain electrode bias ($V_{sd}$=0). As can be seen in FIG. 4(a), with zero source-to-drain bias, the Fermi levels $E_f$ of each of the electrodes 32 and 34 and the nanoparticle 42 coincide. The electrodes 32 and 34 and the nanoparticle 42 are metallic conductors and, therefore, have empty energy states immediately above $E_f$ at zero degrees Kelvin whereas a molecular wire, of lesser electrical conductivity than a metallic element, is characterized by a highest occupied molecular orbital ("HOMO") that lies below $E_f$ and a lowest unoccupied molecular orbital ("LUMO") that lies above $E_f$ at some energy $E_f+\Delta$. The electron resonant tunneling process by which electron flow (current) takes place cannot occur until the (left electrode 32) Fermi level energy is raised to coincide with the energy level of a molecular orbital of the adjacent molecular wire 44 characterized by high transmission probability. Since the molecular wires 44 and 46 are identical in the present invention (having been deposited from the same solution), the energies of the LUMO and HOMO (as well as all other orbitals) of the molecular wires 44 and 46 are aligned at zero voltage difference between the left electrode 32 and the right electrode 34 (source-to-drain voltage) regardless of the gate voltage that may be applied via the conductive substrate 24. (Hereafter, the left electrode 32 will be understood to correspond to a source electrode, the right electrode 34 will be understood to correspond to a drain electrode and the conductive substrate 24 will be understood to correspond to a gate electrode.) Resonant tunneling cannot occur at zero source-to-drain voltage since the available electron states in the electrodes 32 and 34 are lower in energy than the conducting orbital (e.g., LUMO or some other molecular orbital higher in energy with large transmission probability) of the adjacent molecular wires 44 and 46 respectively. Similarly, holes cannot resonantly tunnel through HOMO (or other orbital lower in electron energy) since the available empty states in the adjacent electrodes 32, 34 lie above the HOMO of the adjacent molecular wires 44 and 46 respectively in terms of hole energies.

FIG. 4(b) illustrates the relative energy levels of the electrodes and the conductive path resulting from the imposition of a forward bias source-to-drain voltage $V_{sd}$. This raises the Fermi level of the left electrode 32 by approximately $qV_{sd}/2$ and lowers that of the right electrode 34 by a like amount. (Note: the symmetric changes in the Fermi levels reflect the fact that the molecular wires 44 and 46 are of identical composition.) At some voltage $V_{sd}$, the Fermi level of the electrons of the metal of the left electrode 32 will coincide with the LUMO of the molecular wire 44, allowing resonant tunneling to take place from the left electrode 32 to the nanoparticle 42. Due to the spatial symmetry of the device configuration, similar alignment will take place between the Fermi level in the nanoparticle 42 and the LUMO in the right molecule 46. As the energy mean free path ($l_E$, approximately 1 to 2 nm) is equal to or less than the size of the nanoparticle 42, the electrons that tunnel from the left electrode 32 into the nanoparticle 42 will thermalize. The electrons at the Fermi level in the nanoparticle 42 will then tunnel to the right electrode 34. The electroneutrality of the nanoparticle 42 is preserved throughout this process. The preceding description implies that the conductance of the nanoparticle 42 is much larger than that of the molecular wires 44, 46. Since, for a nanoparticle 42 of the abovementioned size the conductance should be on the order of 100 $\mu$S or more and, for the molecular wires 44 and 46, it is less than 0.1 $\mu$S, the condition of electroneutrality of the nanoparticle 42 is easily obtained.

Figure 5A:
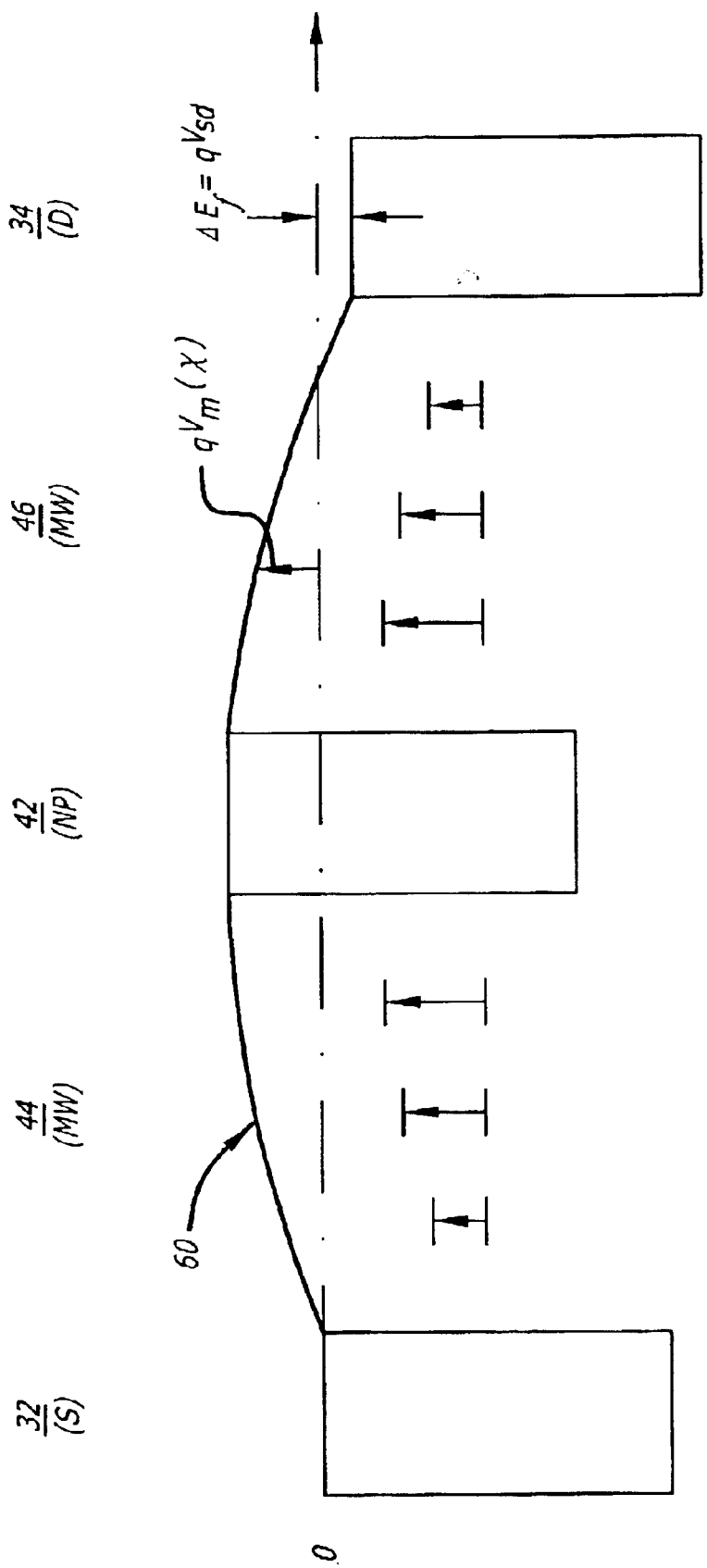
FIGS. 5(a) and 5(b) are an energy diagram and a current-versus-voltage curve, respectively, for illustrating gating in a switch in accordance with an embodiment of the invention.
Figure 5B:
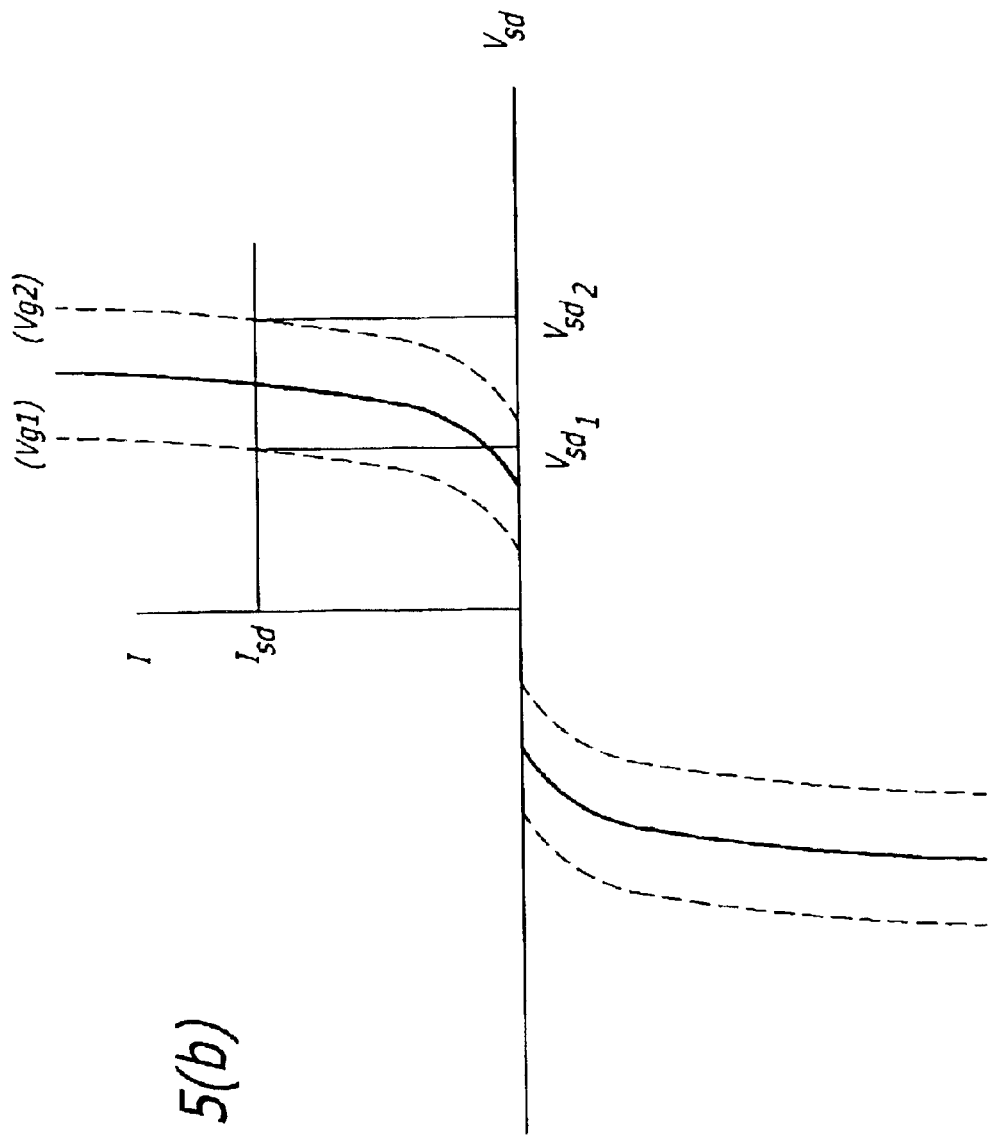

FIGS. 5(a) and 5(b) are an energy diagram and a current-versus-voltage curve, respectively, for illustrating gating in a switch in accordance with an embodiment of the invention. Referring first to FIG. 5(a), the Fermi levels of the metallic left and right electrodes 32, 34 differ by $\Delta E_f = qV_{sd}$ due to the imposition of a forward bias source-to-drain voltage $V_{sd}$. The curve 60 that traverses the gap 30 between the electrodes 32 and 34 represents the shift that occurs in the electron energy states in the components of the conductive path, comprising the molecular wires 44 and 46 and the nanoparticle 42, relative to the Fermi levels of the metallic electrodes 32 and 34 upon the imposition of a gating voltage $V_g$ (note: $V_m$ referenced in FIG. 5(a) represents the effect of the gating field experienced by the conjugated molecules. Such field is less than the field caused by the gating voltage $V_g$ applied at the conductive substrate 24 by a reduction factor that reflects the field screening effect by charge induced on the electrodes 32 and 34 in view of the short length of the gap 30.) As can be seen, the shift is a function of position (x) within the gap 30 separating the electrodes and is constant within the electrodes. It reaches a maximum value of approximately $qV_g(L/2t)$, where 2L is the length of the gap 30 between the electrodes 32 and 34 and t is the effective thickness of the dielectric layer 26 (plus the spacing, if any, between the top of the dielectric layer 26 and the molecular wire at the midpoint between the left electrode 32 and the right electrode 34 (i.e. at the nanoparticle 42). Such position-dependent shifting of the energy levels of the components of the conductive path reflects the effect of the electric field on the device produced by the gating voltage. The profile of the energy shifts results in a change in the energy of the LUMO and HOMO orbitals and, therefore, changes the critical value of source-to-drain voltage which brings these levels into resonance with the Fermi level of, for example, the left electrode 32, leading to an abrupt increase in current. That is, the gate voltage shifts the critical source-to-drain voltage for resonant tunneling through the molecular wires.

Such effects of a gating voltage $V_g$ are illustrated in FIG. 5(b), a current-versus-voltage curve of the gating of a switch in accordance with the invention. It is clear from observation of FIG. 5(b) that the gating voltage shifts the critical voltage for the current increases. Thus, the device of the invention does act as a gated switch, regulating or gating the flow of electrons between the source and drain electrodes 32, 34.

Figure 1:
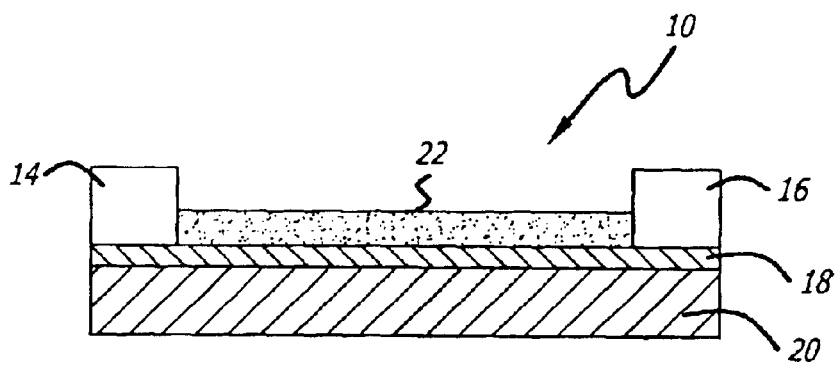
FIG. 1 is a cross-sectional view of a hybrid FET having a channel of organic material in accordance with the prior art.
Figure 6:
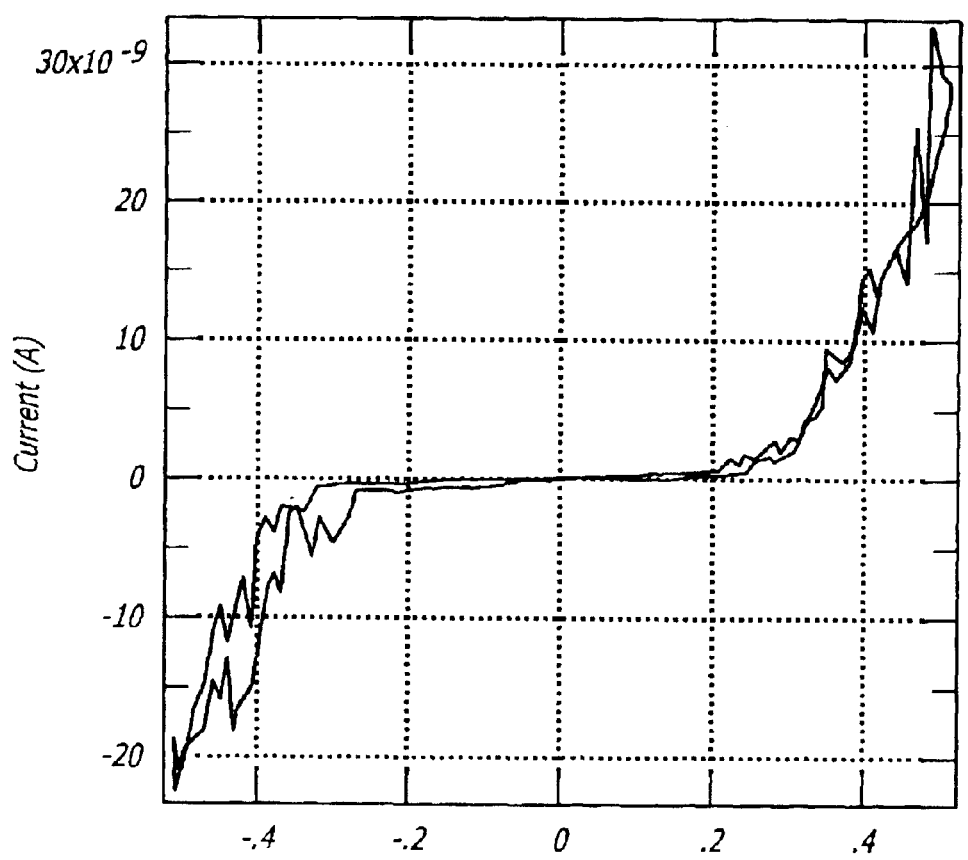
FIG. 6 is a graph of current-versus-voltage measurement data for a molecular wire obtained with a device in accordance with an embodiment of the invention.

As mentioned above, a device in accordance with the invention may be arranged to function as either a gated nanoscale switch or as an apparatus for measuring the electrical characteristics of molecular wires. FIG. 6 is a graph of current-versus-voltage measurement data for a molecular wire obtained by means of a device arranged generally in accordance with the electrical schematic diagram of FIG. 3(b). As mentioned earlier, such an arrangement provides many advantages over test devices that require the separation of test electrodes by approximately the length of the molecule under observation.

The data of FIG. 6 was taken from a device that employed molecular wires of 6-hexanedithiol (HS(CH$_2$)6SH). Similar results have been obtained employing molecular wires of 8-octanedithiol (HS(CH$_2$)8SH). In each of such cases, gold electrodes and a gold nanoparticle of 10 to 20 nm diameter were employed.

The data of FIG. 6 illustrate a relationship between source-to-drain current and voltage having a relatively clear and predictable shape, thus providing usable and valuable data for characterizing the electrical properties of the molecular wires employed in the test device.

Thus it is seen that the present invention provides a device that may be arranged to function as either a three terminal nanoscale switch or as a test device for measuring the electrical characteristic of conductive molecular wires. By employing the teachings of this invention one may obtain operation analogous to a silicon FET in a nanoscale device. Due to reduced channel resistance, such a device requires a smaller source-to-drain voltage and is capable of faster switching speeds due to reduced channel capacitance and resistance. Additionally, as a test device for measuring the electrical characteristics of conductive molecular wires, the invention is substantially easier to arrange and, therefore, to test such molecules than prior art arrangements that require an electrode spacing that is equal to the length of a single molecule.

While this invention has been presented with reference to its presently preferred embodiment, it is not limited thereto. Rather, the invention is limited only insofar as it is defined by the following set of patent claims and includes within its scope all equivalents thereof.

What is claimed is:

1. A nanoscale switch comprising, in combination:
   a) a conductive substrate;
   b) a dielectric layer overlying said conductive substrate;
   c) a first electrode and a second electrode located on said dielectric layer in spaced relation separated by a gap;
   d) a first electrically-conductive molecular wire and a second electrically-conductive molecular wire; and
   e) said first molecular wire being bound to said first electrode and to a conductive nanoparticle and said second molecular wire being bound to said second electrode and to said nanoparticle whereby an electrically-conductive path exists between said first and second electrodes.

2. A nanoscale switch as defined in claim 1 wherein said nanoparticle is of greater electrical conductivity than said first or second molecular wire.

3. A nanoscale switch as defined in claim 2 wherein said electrically conductive nanoparticle is of metallic composition.

4. A nanoscale switch as defined in claim 2 wherein each of said molecular wires comprises a conjugated molecule with anchor end groups.

5. A nanoscale switch as defined in claim 4 wherein said molecules are from the group consisting of 1-dedanethiol, 1,4-bensenedimethanethiol, poly(1.4-phenylene sulfide), (2,4,5-tris-mercaptomethyl-phenyl)methanethiol and 4,4'-thiobisbenzenethiol.

6. A nanoscale switch as defined in claim 1 wherein said conductive substrate comprises silicon.

7. A nanoscale switch as defined in claim 1 wherein said conductive substrate comprises tantalum.

8. A nanoscale switch as defined in claim 1 wherein said dielectric layer comprises an oxide.

9. A nanoscale switch as defined in claim 1 wherein said dielectric layer comprises a nitride.

10. A nanoscale switch as defined in claim 1 wherein said electrodes are of metallic composition.

11. A nanoscale switch as defined in claim 1 wherein said gap is between approximately 1 nm and approximately 5 nm.

12. A nanoscale switch as defined in claim 11 wherein said metallic nanoparticle has a diameter no larger than 20 nm.

13. A nanoscale switch as defined in claim 1 wherein each of said molecular wires is of identical chemical composition.

14. A method for measuring the electrical characteristics of conductive molecular wires comprising the steps of:
   providing a layer of dielectric material; then
   forming a first electrode and a second electrode on said layer of dielectric material having a gap therebetween; then
   bonding a first plurality of electrically-conductive molecular wires to said first electrode; and
   bonding a second plurality of electrically-conductive molecular wires to said second electrode; then
   bonding an electrically-conductive nanoparticle to at least one molecular wire of said first plurality of molecular wires; and
   bonding said electrically-conductive nanoparticle to at least one molecular wire of said second plurality of molecular wires; then
   creating a voltage difference between said first and second electrodes; and then
   measuring a resultant flow of electrical current between electrodes through said molecular wires and said nanoparticle.

15. A method as defined in claim 14 wherein said dielectric layer comprises an oxide.

16. A method as defined in claim 14 wherein said dielectric layer comprises a nitride.

17. A method as defined in claim 14 wherein each of said electrodes is of metallic composition.

18. A method as defined in claim 14 wherein said gap is between approximately 1 nm and approximately 5 nm.

19. A method as defined in claim 13 wherein said molecular wires comprise conjugated molecules with anchor end groups.

20. A method as defined in claim 19 wherein said conjugated molecules are from the group consisting of 1-dedanethiol, 1,4-bensenedimethanethiol, poly(1.4-phenylene sulfide), (2,4,5-tris-mercaptomethyl-phenyl)-methanethiol and 4,4'-thiobisbenzenethiol.

21. A method as defined in claim 14 wherein said electrically conductive nanoparticle is of metallic composition.

22. A method as defined in claim 21 wherein said metallic nanoparticle has a diameter no larger than 20 nm.

23. A method as defined in claim 14 wherein each of said conductive molecular wires is of identical chemical composition.

24. Apparatus for measuring the electrical characteristics of conductive molecular wires comprising, in combination:
   a) a layer of dielectric material;
   b) a first electrode and a second electrode located on said layer of dielectric material in spaced relation separated by a gap;
   c) a first electrically-conductive molecular wire and a second electrically-conductive molecular wire;
   d) said first molecular wire being bound to said first electrode and to a conductive nanoparticle and said second molecular wire being bound to said second electrode and to said nanoparticle whereby an electrically-conductive path exists between said first and second electrodes;
   e) means for establishing a voltage difference between said first and second electrodes; and f) means for measuring the flow of current between said first and second electrodes through said electrically-conductive path in response to said voltage difference between said first and second electrodes.

25. Apparatus as defined in claim 24 wherein said nanoparticle is of greater electrical conductivity than said first or second molecular wire.

26. Apparatus as defined in claim 24 wherein each of said molecular wires is of identical chemical composition.

27. Apparatus as defined in claim 26 further comprising:

a) said nanoparticle being of metallic composition;

b) each of said electrodes being of metallic composition; and c) each of said molecular wires comprising a conjugated molecule with end anchor groups.

* * * * *